United States Patent
Kim et al.

(10) Patent No.: US 9,165,817 B2
(45) Date of Patent: Oct. 20, 2015

(54) METHOD OF GRINDING SUBSTRATE AND METHOD OF MANUFACTURING SEMICONDUCTOR LIGHT EMITTING DEVICE USING THE SAME

(71) Applicant: SAMSUNG ELECTRONICS CO., LTD., Suwon-si, Gyeonggi-do (KR)

(72) Inventors: Jae Yoon Kim, Gyeonggi-do (KR); Seung Jae Lee, Suwon-si (KR); Ha Yeong Son, Suwon-si (KR); Jin Gi Hong, Yongin-si (KR); Seong Deok Hwang, Seoul (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 14/098,105

(22) Filed: Dec. 5, 2013

(65) Prior Publication Data

US 2014/0235000 A1 Aug. 21, 2014

(30) Foreign Application Priority Data

Feb. 20, 2013 (KR) ........................ 10-2013-0018307

(51) Int. Cl.
*H01L 21/00* (2006.01)
*H01L 21/683* (2006.01)
*H01L 33/00* (2010.01)

(52) U.S. Cl.
CPC ........ *H01L 21/6836* (2013.01); *H01L 33/0095* (2013.01); *H01L 2221/68327* (2013.01); *H01L 2221/68381* (2013.01); *H01L 2221/68386* (2013.01); *H01L 2933/0041* (2013.01)

(58) Field of Classification Search
CPC .............. B32B 43/006; H01L 33/0095; H01L 2221/68386; H01L 2221/68381
USPC ..................... 438/68; 156/714, 750
See application file for complete search history.

(56) References Cited

U.S. PATENT DOCUMENTS

| 7,521,122 | B2 | 4/2009 | Noro et al. |
| 2008/0057216 | A1 | 3/2008 | Shintani |
| 2009/0115042 | A1* | 5/2009 | Koyanagi ..................... 257/686 |
| 2009/0314430 | A1* | 12/2009 | Nakamura ..................... 156/344 |
| 2010/0038035 | A1* | 2/2010 | Noda et al. ................. 156/379.6 |
| 2011/0091676 | A1 | 4/2011 | Kim et al. |
| 2011/0139347 | A1 | 6/2011 | Kim et al. |
| 2012/0088316 | A1 | 4/2012 | Lu et al. |

FOREIGN PATENT DOCUMENTS

| JP | 2010183014 A | 8/2010 |
| JP | 2011074246 A | 4/2011 |
| JP | 2012023244 A | 2/2012 |
| JP | 2012062392 A | 3/2012 |
| JP | 2012107194 A | 6/2012 |
| KR | 10-0323949 B1 | 1/2002 |

* cited by examiner

*Primary Examiner* — Caridad Everhart
(74) *Attorney, Agent, or Firm* — McDermott Will & Emery LLP (57) ABSTRACT

A method of grinding a substrate is provided. A substrate including a first main surface having a semiconductor layer formed thereon and a second main surface opposed to the first main surface is prepared. A support film is attached to the first main surface using a glue. The second main surface of the substrate is ground so as to reduce a thickness of the substrate. The support film is removed from the first main surface by applying force to the support film in a non-traverse direction.

20 Claims, 8 Drawing Sheets

METHOD OF GRINDING SUBSTRATE AND METHOD OF MANUFACTURING SEMICONDUCTOR LIGHT EMITTING DEVICE USING THE SAME

CROSS-REFERENCE TO RELATED APPLICATIONS

This application claims the benefit of priority to Korean Patent Application No. 10-2013-0018307, filed on Feb. 20, 2013, in the Korean Intellectual Property Office, the disclosure of which is incorporated herein by reference in its entirety.

BACKGROUND

The present disclosure relates to a method of grinding a substrate and in particular, relates to a method of grinding a substrate on which a semiconductor layer is formed and a method of manufacturing a semiconductor light emitting device using the same.

In manufacturing a semiconductor device, a process of reducing a substrate thickness, that is, a wafer thickness, has been employed.

Specifically, in a manufacturing process of a semiconductor device, such as a semiconductor light emitting diode (LED) or a power semiconductor device, a process of grinding a substrate has been undertaken in order to facilitate the cutting of the substrate (or a wafer) after forming a semiconductor layer thereon or to realize a slim feature of the semiconductor device. In particular, using conventional methodologies, such a process has been limited to being applied to a substrate having a high degree of hardness.

Further, strength of the substrate having a reduced thickness during or after the grinding thereof may be rapidly degraded, the substrate can be easily damaged or broken. Also, an additional cleaning process may be needed and thus results in a lower process efficiency of the manufacturing process.

SUMMARY

The inventive concept(s) described herein provide a method of grinding a substrate or a method of manufacturing a semiconductor light emitting device in which higher process efficiency can be obtained. An exemplary embodiment of the inventive concept provides a method of grinding a substrate, capable of easily removing a support structure without an unnecessary process, while ensuring sufficient workability in a grinding process for reducing a thickness of the substrate having a semiconductor layer formed thereon. Another exemplary embodiment of the inventive concept provides a method of manufacturing a semiconductor light emitting device using the same.

According to an exemplary embodiment of the inventive concept provided herein, a method of grinding a substrate is provided as follows. A substrate including a first main surface having a semiconductor layer thereon and a second main surface opposed to the first main surface is prepared. A support film is attached to the first main surface using a glue. The glue is cured by applying energy thereto. The second main surface of the substrate is ground so as to reduce a thickness of the substrate, and the support film is removed from the first main surface by applying force to the support film in a non-traverse direction.

The attaching of the support film may include: applying the glue to the first main surface of the substrate; disposing the support film on the first main surface to which the glue is applied; and fixing the support film to the first main surface of the substrate by curing the glue.

Traverse mode bonding strength between the support film and the semiconductor layer, which is realized through the cured glue, may be about 0.5 Gpa or more.

Longitudinal mode bonding strength between the cured glue and the semiconductor layer may be lower than longitudinal mode bonding strength between the support film and the cured glue.

The support film may have a thickness of about 200 to 700 μm.

The support film may include a base film and a bonding reinforcement layer disposed on a surface of the base film, bonding strength between the bonding reinforcement layer and the cured glue being greater than bonding strength between the base film and the cured glue.

The base film may include polycarbonate (PC) or polyethylene terephthalate (PET).

The bonding reinforcement layer may include at least one of an acrylic resin and a silicon resin.

The glue may be a heat curable glue or an ultraviolet curable glue.

The removing of the support film from the first main surface may include attaching an adhesive tape to the support film; and separating the support film from the first main surface along with the glue by lifting the adhesive tape in the non-traverse direction.

The separating of the support film from the first main surface may be performed by lifting the adhesive tape in an almost vertical direction.

Another exemplary embodiment of the inventive concept provides a method of manufacturing a semiconductor light emitting device. A wafer including a first main surface, on which an epitaxial layer for a semiconductor light emitting device is disposed, and a second main surface opposed to the first main surface is prepared. A support film is attached to the first main surface using a glue. The glue is cured by applying energy thereto. The second main surface of the wafer is ground so as to reduce a thickness of the wafer. The support film is removed from the first main surface by applying force to the support film in a non-traverse direction, and the wafer is cut into individual light emitting devices.

The wafer may be a sapphire substrate.

The exemplary method of manufacturing the semiconductor light emitting device further include: applying an optical element to the second main surface, between the grinding of the second main surface and the removing of the support film.

The optical element may include an optical lens or a fluorescent film.

Another exemplary embodiment of the inventive concept provides a method of manufacturing light emitting devices. A wafer comprising a substrate including a first main surface, on which a semiconductor layer is disposed, and a second main surface opposed to the first main surface is prepared. A support film is attached to the first main surface using a glue. The second main surface of the wafer is ground so as to reduce a thickness of the wafer. The support film is removed from the first main surface by applying force to the support film in a non-traverse direction, and the wafer is cut into a plurality of light emitting devices.

The semiconductor layer may include an epitaxial layer for semiconductor light emitting devices.

Traverse mode bonding strength between the support film and the semiconductor layer may be about 0.5 Gpa or more. The attaching of the support film may include curing the glue by applying energy thereto. Also, the removing of the support film from the first main surface may include: attaching an adhesive tape to the support film; and separating the support film from the first main surface along with the glue by lifting the adhesive tape in the non-traverse direction.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION OF EXEMPLARY EMBODIMENTS

Hereinafter, exemplary embodiments of the present disclosure will be described in detail with reference to the accompanying drawings. The inventive concept of the present disclosure may, however, be embodied in many different forms and should not be construed as being limited to the exemplary embodiments set forth herein. Rather, these embodiments are provided so that this disclosure will be thorough and complete, and will fully convey the scope of the inventive concept to those skilled in the art. In the drawings, the shapes and dimensions of elements may be exaggerated for clarity, and the same reference numerals will be used throughout to designate the same or like elements.

Figure 1:
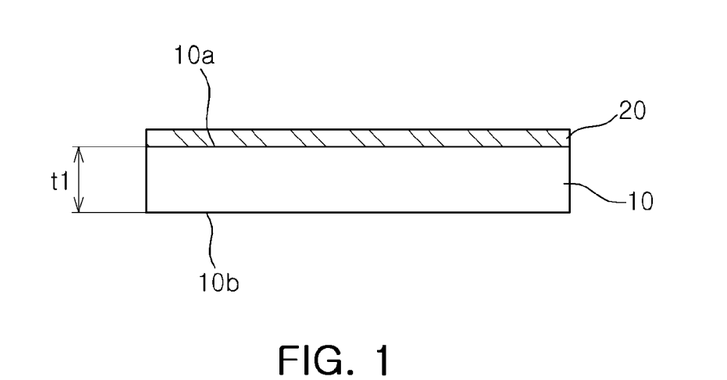
FIGS. 1 through 5 are cross-sectional views illustrating respective main processes of a method of grinding a substrate according to an exemplary embodiment of the present inventive concept.
Figure 2:
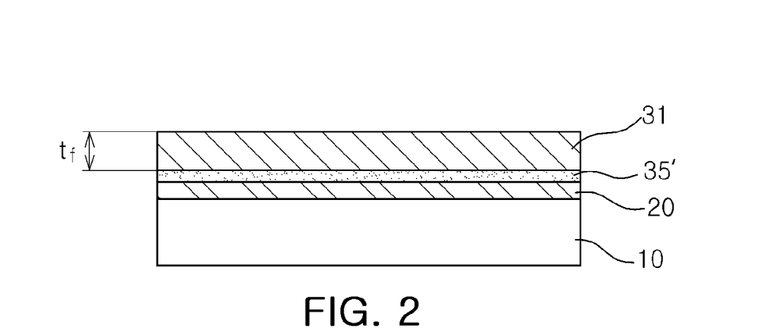
Figure 3:
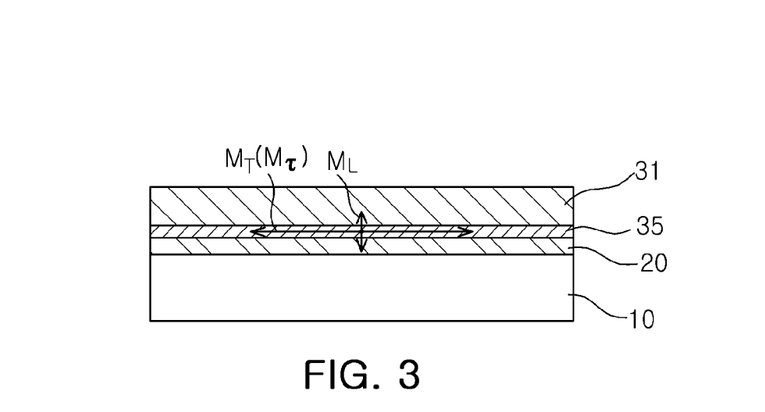

FIGS. 1 through 5 are cross-sectional views illustrating respective main processes of a method of grinding a substrate according to an exemplary embodiment of the present inventive concept. In the method of grinding a substrate according to the exemplary embodiment, an attachment process of a support film may initially be performed as illustrated in FIGS. 1 to 3.

First, as shown in FIG. 1, a substrate 10 includes a first main surface 10a, on which a semiconductor layer 20 is formed, and a second main surface 10b opposed to the first main surface 10a.

The substrate 10 includes a predetermined thickness t1. The substrate 10 may have the thickness t1 of several hundred μm or more, suitable for a semiconductor growth substrate. The substrate 10 may be a semiconductor substrate formed of a material such as silicon (Si), sapphire, SiC, $MgAl_2O_4$, MgO, $LiAlO_2$, $LiGaO_2$, GaN, or the like. In particular, since a sapphire substrate may have a relatively high degree of hardness, the method of grinding a substrate according to the exemplary embodiment may be usefully applied to the sapphire substrate.

The semiconductor layer 20 is formed on the first main surface 10a of the substrate 10. The semiconductor layer 20 is a semiconductor device performing a specific function. For example, the semiconductor layer 20 can be a semiconductor light emitting diode (LED) or a power semiconductor device. The semiconductor layer 20 of FIG. 1 may also have a multilayer structure or may be formed in various manners in order to realize a desired semiconductor device.

Next, as illustrated in FIG. 2, a support film 31 is attached to the first main surface 10a using a glue 35'.

The glue 35' employed in the exemplary embodiment may be an energy curable glue, and, for example, may be a heat or an ultraviolet curable material, which is cured and thus is not elastically deformed in the event that energy such as heat or ultraviolet rays is applied thereto. In an exemplary process, the glue' 35, an uncured substance having fluidity, may be applied to the first main surface 10a, that is, the semiconductor layer 20, to connect the support film 31 and the semiconductor layer 20.

A bonding strength of the glue 35' may be directionally varied to provide workability suitable for a grinding process, as well as ensuring easy removal of the support film 31 in a subsequent process.

The support film 31 may be a film having a thickness suitable to allow the substrate having a thickness reduced to a desired level to be treated without damage to the substrate, while ensuring workability during the grinding process of the substrate. The support film 31 may have a thickness $t_f$ of 200 to 700 μm. For example, the support film 31 may include polycarbonate (PC) or polyethylene terephthalate (PET).

Next, as illustrated in FIG. 3, a glue 35 is cured by applying energy thereto, such that the support film 31 is fixed to the substrate (that is, the semiconductor layer).

In the process, the glue may be cured by applying energy such as heat or ultraviolet rays thereto so as to fix the semiconductor layer 20 and the support film 31 thereto. The glue employed in the embodiment may be advantageous in that it may facilitate the process of removal of the support film.

Specifically, the glue 35 in a cured state may tend to have significantly high degrees of traverse mode bonding strength $M_T$ and torsional mode bonding strength $M_\tau$ while having a significantly low degree of longitudinal mode bonding strength $M_L$.

The traverse mode bonding strength $M_T$ and torsional mode bonding strength $M_\tau$ generally relate to stress acting in a traverse direction, that is, a direction parallel to a bonding interface, and may refer to bonding strength relating to stress applied during the grinding process. On the other hand, the longitudinal mode bonding strength $M_L$ may be understood as bonding strength relating to stress acting in a non-traverse direction.

The term "stress acting in a non-traverse direction" or "force acting in a non-traverse direction" may refer to elements other than stress or force acting in a direction substantially parallel to the bonding interface and may include stress applied in a direction perpendicular to the bonding interface as well as force acting obliquely so as to have an angle of about 20° or more with respect to the bonding interface.

Thus, when the longitudinal mode bonding strength $M_L$ is increased, it may mean that bonding is maintained even in the case of the higher degree of stress acting in the non-traverse direction or the higher degree of force acting in the non-traverse direction, while when the longitudinal mode bonding strength $M_L$ is reduced, it may mean that bonding is weak in the case of the stress acting in the non-traverse direction or the force acting in the non-traverse direction.

Figure 4:
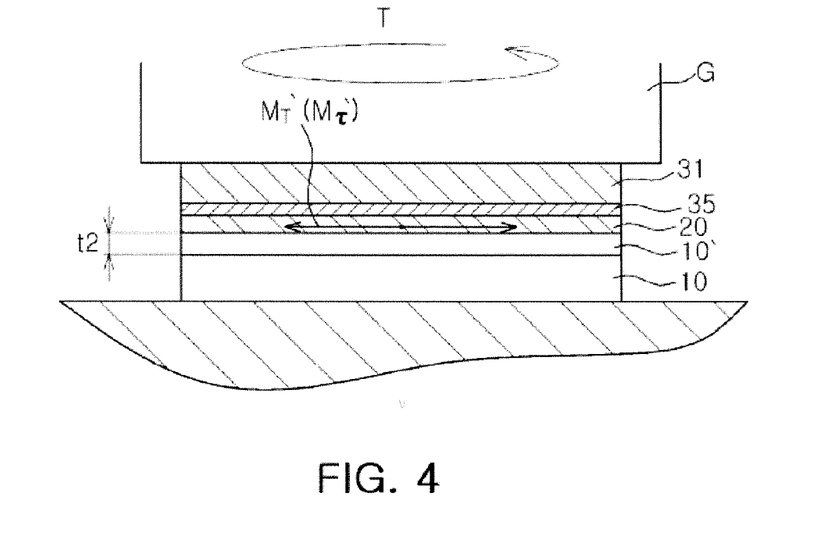
Figure 5:
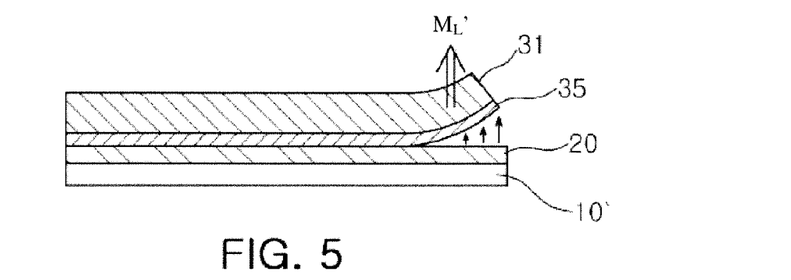

Specifically, the description will be provided with reference to FIGS. 4 and 5. Referring to FIG. 4, the second main surface 10b of the substrate 10 may be ground so as to reduce the thickness t1 of the substrate 10.

In the process, the support film 31 may be fixed to a grinding holder G and the second main surface 10b of the substrate 10 may be attached to a grinding pad P to thereby perform the grinding process. The thickness of the substrate 10 may be reduced to a desired thickness t2 using the grinding process. Through the reduction in thickness of the substrate 10, a subsequent chip separation process may be facilitated and a chip thickness may be reduced. If necessary, a process of adding additional elements to the second main surface 10b of the ground substrate may be performed.

As illustrated in FIG. 4, since the grinding process may be performed through rotational motion in the traverse direction, as denoted by an arrow of FIG. 4, stress may be applied to the glue 35 in a direction almost parallel to the bonding interface.

As described above, since the glue 35 employed in the embodiment may have higher degrees of traverse mode bonding strength $M_T$ and torsional mode bonding strength $M_\tau$ than those of stress $M_T'$ and stress $M_\tau'$ applied to the grinding process, bonding may be maintained even during the grinding process to ensure sufficient workability. For example, the traverse mode bonding strength $M_T$ of the glue 35 may be at least 0.1 Gpa in consideration of a general grinding process. In the case of a substrate formed of sapphire having a high degree of hardness, the traverse mode bonding strength $M_T$ of the glue 35 may be about 0.5 Gpa or more.

Next, as illustrated in FIG. 5, the support film 31 may be removed from the first main surface 10a by applying force to the support film 31 in the non-traverse direction.

As described above, the glue 35 used in the exemplary embodiment may have high degrees of traverse mode bonding strength $M_T$ and torsional mode bonding strength $M_\tau$ while having a low degree of longitudinal mode bonding strength $M_L$. That is, bonding may be maintained with an application of a high degree of stress during the grinding process, but the support film 31 may be easily separated from the substrate (that is, the semiconductor layer) by stress (force) acting in the non-traverse direction. That is, as illustrated in FIG. 5, the support film 31 may be easily separated from the substrate 10 by stress $M_L'$ acting in a direction almost perpendicular to the bonding interface.

The exemplary embodiment exemplifies the case in which the support film 31 is separated from the substrate in an almost vertical direction, but is not limited thereto. Even in the case in which the support film 31 is separated from the substrate 10 by stress acting in a direction other than a direction almost parallel to the bonding interface, that is, stress acting at an angle of inclination of at least 20° with respect to the bonding interface, the support film 31 may be relatively easily separated from the substrate 10.

In addition, as illustrated in FIG. 5, in order to remove the support film 31 along with the glue 35, longitudinal mode bonding strength between the cured glue 35 and the semiconductor layer 20 may be lower than longitudinal mode bonding strength between the support film 31 and the cured glue 35.

In this case, the longitudinal mode bonding strength between the cured glue 35 and the semiconductor layer 20 may be low such that separation thereof may be easily achieved using an adhesive tape or the like.

Although not described in the embodiment, additional processes may be further included in the method of grinding a substrate, prior to the process of removing the support film. For example, other elements may be added to the second main surface of the ground substrate, or an additional processing process may be performed.

Another aspect of the present disclosure provides a method of manufacturing a semiconductor light emitting device. In the manufacturing method, a semiconductor layer formed on a wafer may be formed of a plurality of epitaxial layers for semiconductor light emitting devices. The exemplary embodiment will be described below with reference to FIGS. 6 to 15.

Figure 6:
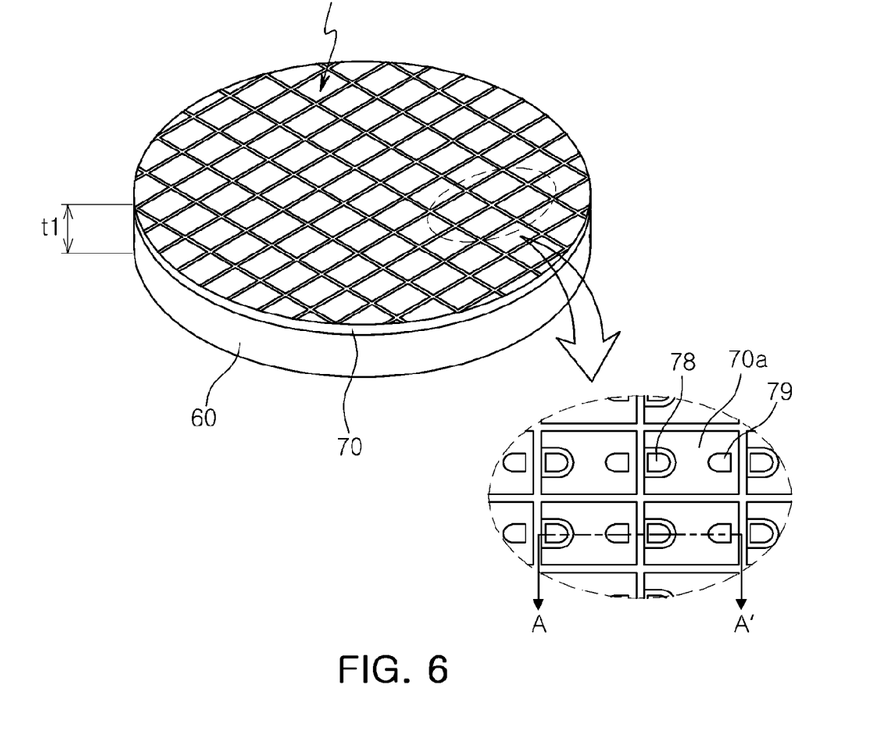
FIGS. 6 through 8 are cross-sectional views illustrating an attachment process of a support film during a method of manufacturing a semiconductor light emitting device according to an exemplary embodiment of the present inventive concept.

As illustrated in FIG. 6, a semiconductor laminate 70 for a plurality of semiconductor light emitting devices such as semiconductor LEDs may be provided on a wafer 60. In the process, the semiconductor laminate 70 may be divided into individual unit chips 70a through isolation etching I. Each unit chip 70a (hereinafter referred to as "a semiconductor light emitting device 70a") of the semiconductor laminate 70 may be provided with first and second electrodes 78 and 79.

Figure 11:
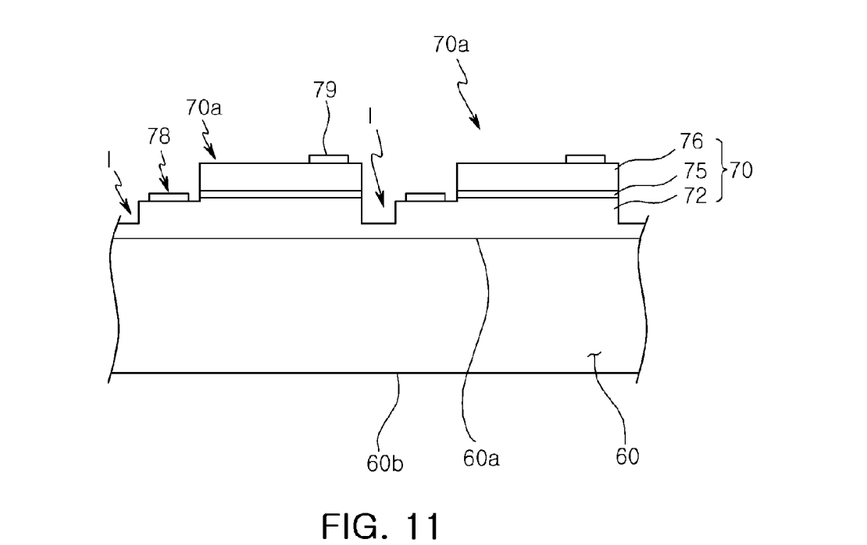
FIG. 11 is a cut-away cross-sectional view of a wafer shown in FIG. 6, taken along line A-A'.

Specifically, a semiconductor laminate structure for LEDs will be described with reference to FIG. 11. FIG. 11 is a cut-away cross-sectional view of an exemplary wafer shown in FIG. 6, taken along line A-A'.

As illustrated in FIG. 11, the semiconductor light emitting device 70a includes the semiconductor laminate 70 comprising a first conductivity type semiconductor layer 72, an active layer 75, and a second conductivity type semiconductor layer 76, and is formed on the wafer 60. As needed, a buffer layer, a base layer or a polarity modifying layer may be formed between the wafer 60 and the semiconductor laminate 70. The first and second electrodes 78 and 79 may be formed on the first conductivity type semiconductor layer 72 and the second conductivity type semiconductor layer 76 exposed through mesa-etched regions. Further, the semiconductor light emitting device 70a may include an ohmic electrode layer (not shown) formed on the second conductivity type semiconductor layer 76.

For example, the wafer 60 may be a sapphire substrate and the semiconductor laminate 70 may be a nitride semiconductor layer for LEDs. The substrate 10 may have the predetermined thickness t1. The substrate 10 may have the thickness t1 of several hundred μm or more, suitable for a semiconductor growth substrate.

Figure 7:
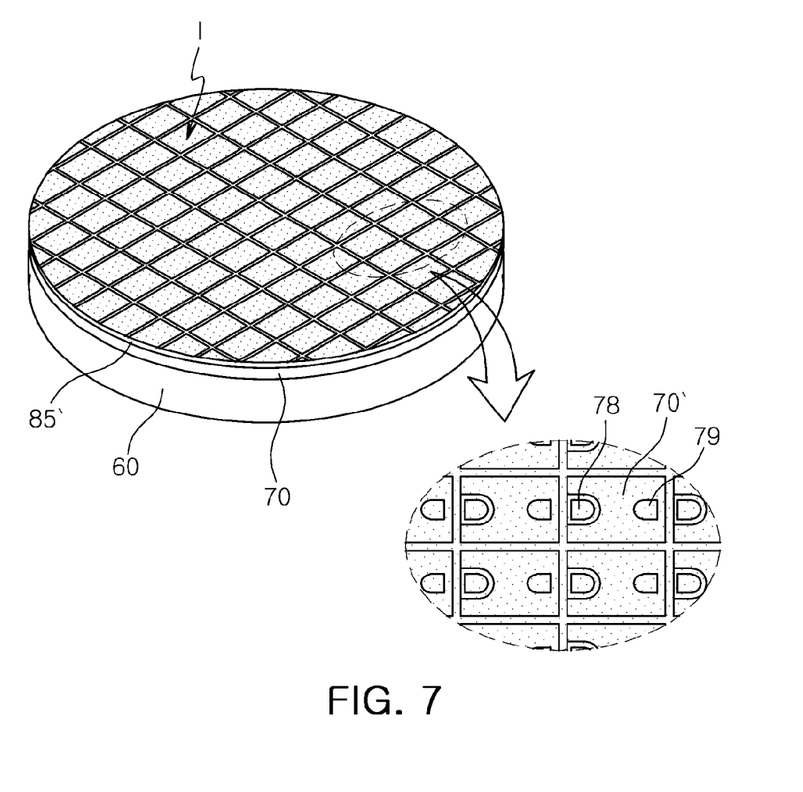

Next, as illustrated in FIG. 7, glue 85' may be applied to the wafer 60 on which the semiconductor laminate 70 is formed.

The application process of the glue 85' to the wafer 60 may be performed through a screen printing process or a spin coating process using the glue 85' that has not been cured and that has fluidity. The condition of the glue 85' that may be selected in the exemplary embodiment may be similar to that of the glue 35' according to the foregoing embodiment. That is, the glue 85' may be a heat or ultraviolet curable material, which is cured and thus is not elastically deformed when energy such as heat or ultraviolet rays are applied. A bonding strength of the glue 85' may be varied depending on a direction in which stress acts thereon.

Specifically, the glue 85' used in the exemplary embodiment may also have significantly high degrees of traverse mode bonding strength and torsional mode bonding strength while having a significantly low degree of longitudinal mode bonding strength. Thus, when stress acts in the traverse direction during the grinding process, excellent workability can be obtained due to a high degree of longitudinal mode bonding strength. A separation process may be facilitated by applying force to the support film in a non-traverse direction during the separation process using a low degree of longitudinal mode bonding strength. This will be described in detail in the following processes.

Figure 8:
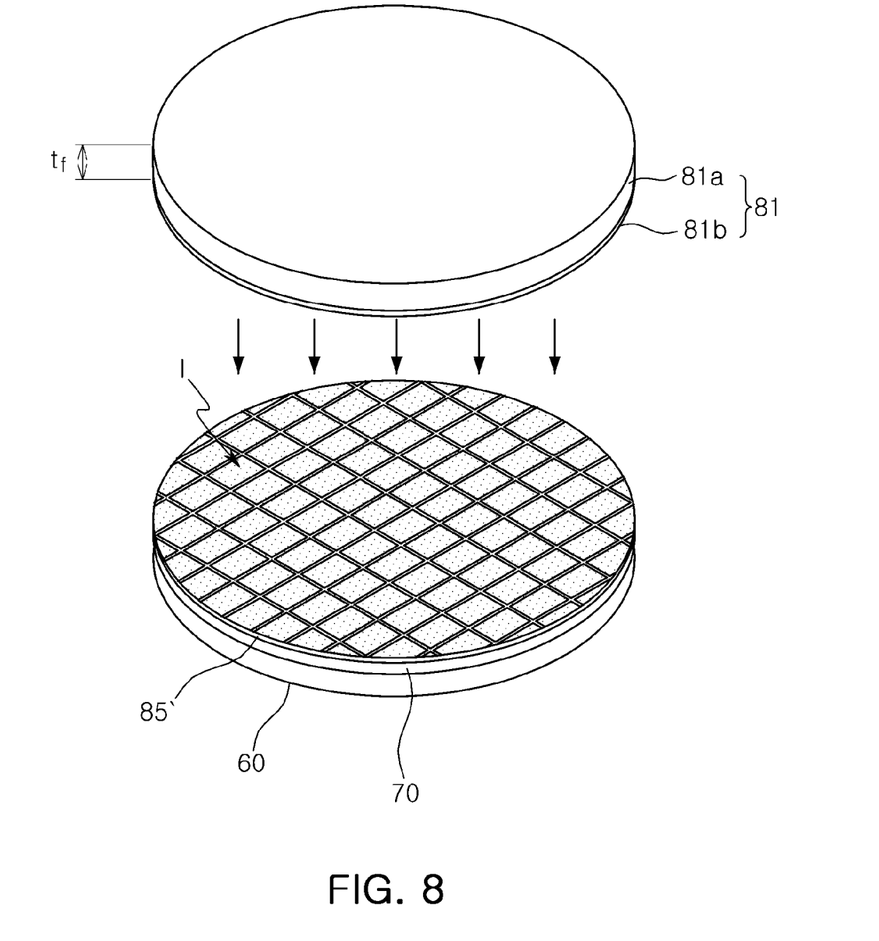

As illustrated in FIG. 8, a support film 81 may be disposed on the applied glue 85' before the glue 85' is cured.

The support film 81 may be a film having a thickness suitable to allow the substrate having a thickness reduced to a desired level to be treated without damage to the substrate, while ensuring workability during the grinding process of the substrate. The support film 81 may have the thickness $t_f$ of about 200 to 700 μm.

In the exemplary embodiment, the support film 81 includes a base film 81a and a bonding reinforcement layer 81b formed on a surface of the base film 81a. Here, the bonding reinforcement layer 81b may be provided on a surface of the support film 81 directly contacting glue 85, and may be formed of a material having a higher degree of bonding strength with respect to the glue 85 than bonding strength between the base film 81a and the glue 85 in a cured state. In this case, bonding strength may generally refer to bonding strength in a vertical direction. In this manner, the support film 81 may include the bonding reinforcement layer 81b to impart a high degree of bonding strength between the glue 85 and the support film 81, such that the cured glue 85 and the support film 81 may be completely separated from the semiconductor laminate 70 in a subsequent separation process.

The base film 81a may include polycarbonate (PC) or polyethylene terephthalate (PET), but is not limited thereto. The bonding reinforcement layer 81b may include an acrylic resin or a silicon resin and may have a double layer structure such as an acrylic resin layer/silicon resin layer. Here, the acrylic resin layer may be disposed to contact the glue.

Figure 9:
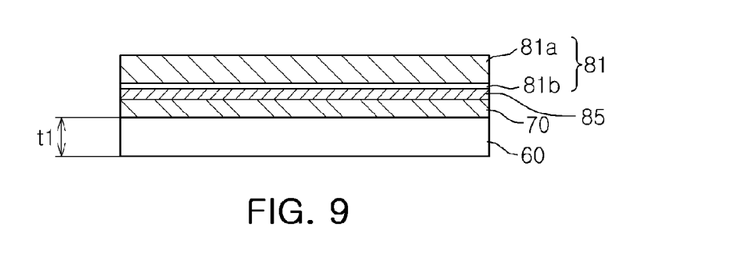
FIGS. 9 through 10 are cross-sectional views illustrating a process of grinding the substrate in an assembly of FIG. 8.

Next, as illustrated in FIG. 9, the glue 85 is cured by applying energy thereto, such that the support film 81 is fixed to the substrate (that is, the semiconductor layer).

In the process, the glue 85 may be cured by applying energy such as heat or ultraviolet rays thereto so as to fix the semiconductor laminate 70 and the support film 81 thereto. The glue 85 employed in the exemplary embodiment may be advantageous in that it may facilitate the process of removing the support film.

Figure 10:
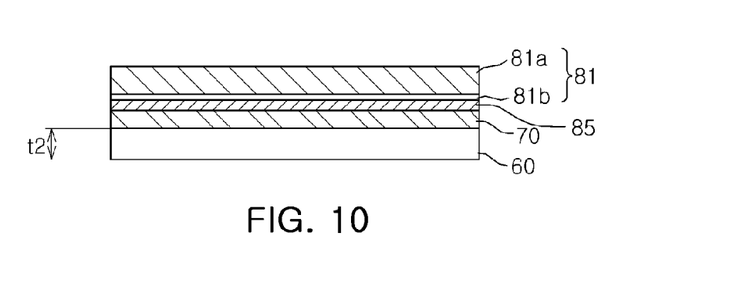

Next, as illustrated in FIG. 10, the second main surface of the wafer 60 may be ground so as to reduce the thickness t1 of the wafer 60 to the desired thickness t2.

The thickness t1 of the wafer 60 is reduced to the desired thickness t2 using the grinding process as in the process of FIG. 4. In this manner, the thickness of the wafer 60 is reduced to facilitate a subsequent chip separation process and as a result a chip thickness may be reduced. If necessary, a process of adding other elements to the wafer 60 may be performed.

Even in the case that a high degree of stress acts in the traverse direction during the grinding process, since a high degree of bonding strength is provided in a direction almost parallel to the bonding interface due to the glue 85, bonding between the support film 81 and the wafer 60 can be firmly maintained during the grinding process. As described above, the traverse mode bonding strength $M_T$ of the glue 85 may be at least 0.1 Gpa such that the bonding is maintained during the grinding process to ensure sufficient workability. In particular, in the case of a substrate formed of sapphire having a high degree of hardness, the traverse mode bonding strength $M_T$ of the glue 85 is 0.5 Gpa or more.

Figure 12:
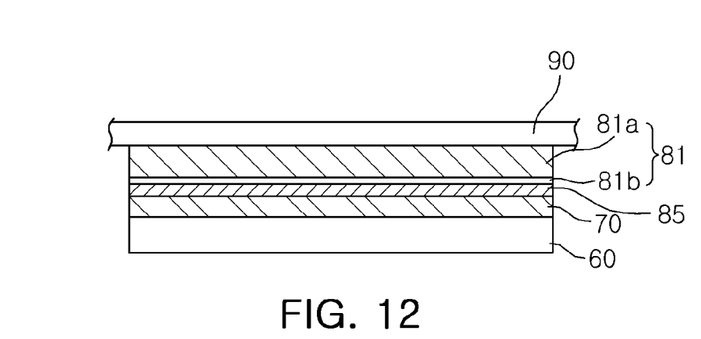
FIGS. 12 through 14 are cross-sectional views illustrating a process of removal of the support film during the method of manufacturing a semiconductor light emitting device according to the exemplary embodiment of the present inventive concept.
Figure 13:
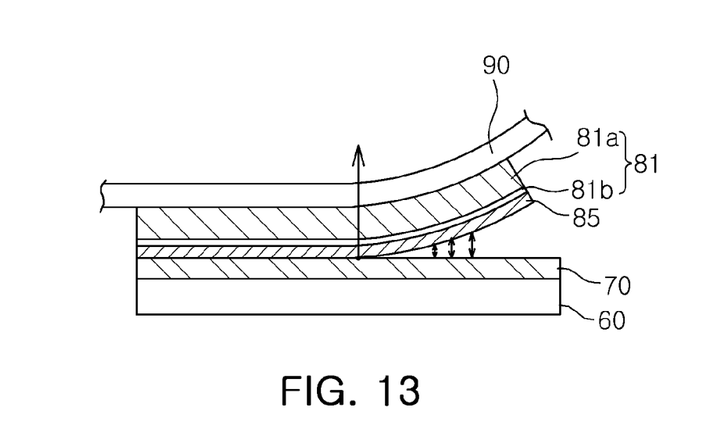
Figure 14:
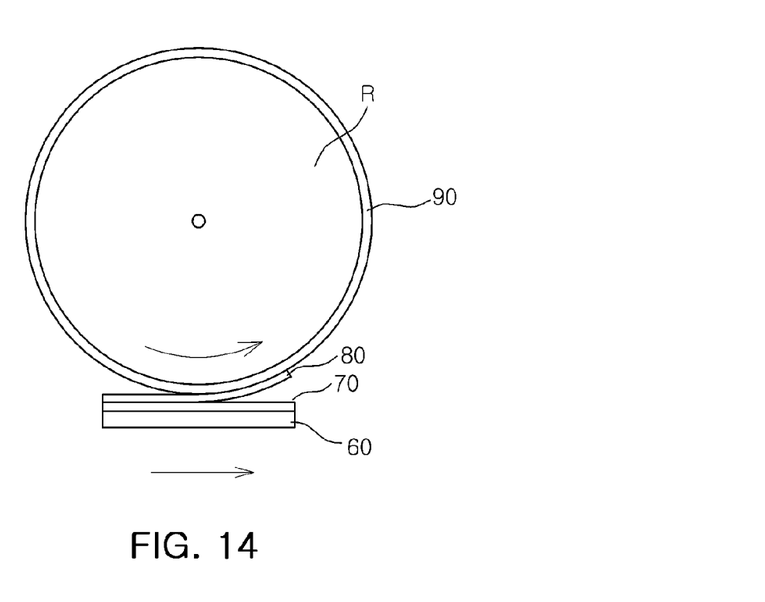

FIGS. 12 through 14 are cross-sectional views illustrating a process of removing the support film during the method of manufacturing a semiconductor light emitting device according to the exemplary embodiment of the present inventive concept.

As illustrated in FIG. 12, an adhesive tape 90 is attached to the support film 81.

In the exemplary process, the adhesive tape 90 may be used to remove the support film 81 along with the glue 85. After bonding the adhesive tape 90 to the support film 81, the adhesive tape 90 may be lifted in the non-traverse direction to separate the support film 81 and the glue 85 from the first main surface.

As described above, longitudinal mode bonding strength between the cured glue 85 and the semiconductor laminate 70 may be lower than longitudinal mode bonding strength between the bonding reinforcement layer 81b of the support film 81 and the cured glue 85.

In addition, since longitudinal mode bonding strength between the adhesive tape 90 and the support film 81 is greater than longitudinal mode bonding strength between the cured glue 85 and the semiconductor laminate 70, a support structure layer 80 including the cured glue 85 and the support film 81, as well as the adhesive tape 90 may be smoothly removed from the semiconductor laminate 70 when force is applied in the vertical direction as in FIG. 13.

The exemplary embodiment exemplifies the case in which the support film 81 is separated from the semiconductor laminate 70 in an almost vertical direction, but is not limited thereto. Even in the case in which the support film 81 is separated from the semiconductor laminate 70 by stress acting in a direction other than the direction almost parallel to the bonding interface, that is, by stress acting at an angle of inclination of at least 20° with respect to the bonding interface, the support film 81 may be relatively easily separated from the semiconductor laminate 70.

The process of removal of FIG. 13 may be more easily performed using a process involving a roll R, as illustrated in FIG. 14. In FIG. 14, the adhesive tape 90 is attached to a surface of the roll R, the support film 81 of an assembly (refer to FIG. 11) is adhered to the adhesive tape 90 while the roll R rotates, and the support film 81 is lifted by force acting in the non-traverse direction during movements of the roll R, whereby the support structure layer 80 including the support film 81 and the glue 85 can be automatically removed from the semiconductor laminate 70.

Figure 15:
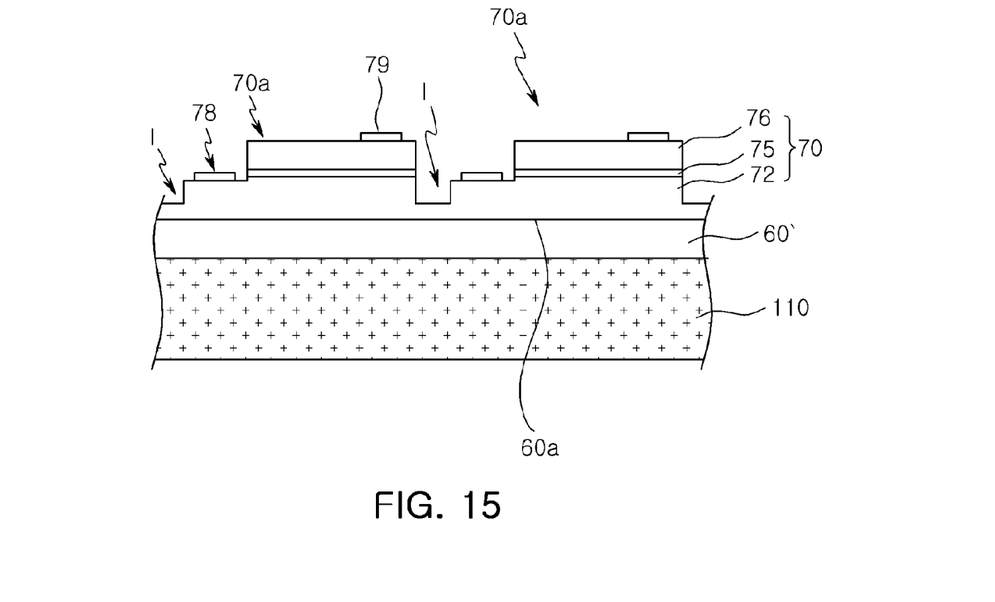
FIG. 15 is cross-sectional view illustrating an exemplary application of a fluorescent film to a ground rear surface of the substrate from which the support film has been removed.

FIG. 15 is a cross-sectional view illustrating an example of applying a fluorescent film to the ground second main surface of the wafer (in a state in which the support structure layer is removed).

Chip separation may be facilitated after the grinding of the wafer and further, sliminess of chips may be realized. In addition, an optical element may be added to the second main surface of the wafer. The optical element may include an optical lens and a fluorescent film. FIG. 15 illustrates the case to which the fluorescent film is applied, and in the case of a ceramic fluorescent layer, it may reinforce vulnerability to damage of the wafer in accordance with thinning of the wafer.

As described above, according to exemplary embodiments of the inventive concept, during a grinding process to reduce a thickness of a substrate having a semiconductor layer formed thereon, bonding strength between a support structure and the substrate can be sufficiently maintained to secure a desired degree of workability, and in a process of removing the support structure, the support structure can be easily removed without an unnecessary process such as a cleaning process or a chemical treatment process.

While the present inventive concept has been illustrated and described in connection with the exemplary embodiments, it will be apparent to those skilled in the art that modifications and variations can be made without departing from the spirit and scope of the present inventive concept as defined by the appended claims.

It is understood that any specific order or hierarchy of steps in the processes described is an illustration of example approaches. Based upon design preferences, it is understood that the specific order or hierarchy of steps in the processes can be rearranged, or that all illustrated steps be performed. Some of the steps can be performed simultaneously.

The word "example" is used herein to mean "serving as an example or illustration." Any aspect or technique of methodologies or processes described herein as "example" is not necessarily to be construed as preferred or advantageous over other aspects or techniques.

What is claimed is:

1. A method of grinding a substrate, the method comprising:
    preparing a substrate including a first main surface having a semiconductor layer thereon and a second main surface opposed to the first main surface;
    attaching a support film to the first main surface using a glue;
    curing the glue by applying energy thereto;
    grinding the second main surface of the substrate so as to reduce a thickness of the substrate; and
    removing the support film from the first main surface by applying force to the support film in a non-traverse direction,
    wherein longitudinal mode bonding strength between the cured glue and the semiconductor layer is lower than longitudinal mode bonding strength between the support film and the cured glue.

2. The method of claim 1, wherein the attaching of the support film includes:
    applying the glue to the first main surface of the substrate;
    disposing the support film on the first main surface to which the glue is applied; and
    fixing the support film to the first main surface of the substrate by curing the glue.

3. The method of claim 1, wherein traverse mode bonding strength between the support film and the semiconductor layer, realized through the cured glue, is about 0.5 Gpa or more.

4. The method of claim 1, wherein the support film has a thickness of about 200 to 700 μm.

5. The method of claim 1, wherein the glue is a heat curable glue or an ultraviolet curable glue.

6. The method of claim 1, wherein the support film includes a base film and a bonding reinforcement layer disposed on a surface of the base film, bonding strength between the bonding reinforcement layer and the cured glue being greater than bonding strength between the base film and the cured glue.

7. The method of claim 6, wherein the base film includes polycarbonate (PC) or polyethylene terephthalate (PET).

8. The method of claim 6, wherein the bonding reinforcement layer includes at least one of an acrylic resin and a silicon resin.

9. The method of claim 1, wherein the removing of the support film from the first main surface includes:
    attaching an adhesive tape to the support film; and
    separating the support film from the first main surface along with the glue by lifting the adhesive tape in the non-traverse direction.

10. The method of claim 9, wherein the separating of the support film from the first main surface is performed by lifting the adhesive tape in an almost vertical direction.

11. A method of manufacturing a semiconductor light emitting device, the method comprising:
    preparing a wafer including a first main surface on which an epitaxial layer for a semiconductor light emitting device is disposed and a second main surface opposed to the first main surface;
    attaching a support film to the first main surface using a glue;
    curing the glue by applying energy thereto;
    grinding the second main surface of the wafer so as to reduce a thickness of the wafer;
    removing the support film from the first main surface by applying force to the support film in a non-traverse direction; and
    cutting the wafer into individual light emitting devices.

12. The method of claim 11, wherein the wafer is a sapphire substrate.

13. The method of claim 11, further comprising: applying an optical element to the second main surface, between the grinding of the second main surface and the removing of the support film.

14. The method of claim 13, wherein the optical element includes an optical lens or a fluorescent film.

15. A method of manufacturing light emitting devices, the method comprising:
    preparing a wafer comprising a substrate including a first main surface on which a semiconductor layer is disposed and a second main surface opposed to the first main surface;
    attaching a support film to the first main surface using a glue;
    grinding the second main surface of the wafer so as to reduce a thickness of the wafer;
    removing the support film from the first main surface by applying force to the support film in a non-transverse direction; and
    cutting the wafer into a plurality of light emitting devices.

16. The method of claim 15, wherein the semiconductor layer includes an epitaxial layer for semiconductor light emitting devices.

17. The method of claim 15, wherein traverse mode bonding strength between the support film and the semiconductor layer is about 0.5 Gpa or more.

18. The method of claim 15, wherein the attaching of the support film comprises curing the glue by applying energy thereto.

19. The method of claim 15, wherein the removing of the support film from the first main surface comprises:
    attaching an adhesive tape to the support film; and
    separating the support film from the first main surface along with the glue by lifting the adhesive tape in the non-traverse direction.

20. The method of claim 15, wherein traverse mode bonding strength between the support film and the semiconductor layer, realized through the cured glue, is about 0.5 Gpa or more.

* * * * *